United States Patent
Wang et al.

(10) Patent No.: US 9,671,457 B2
(45) Date of Patent: Jun. 6, 2017

(54) 3D IC TESTING APPARATUS

(71) Applicant: Taiwan Semiconductor Manufacturing Company, Ltd., Hsin-Chu (TW)

(72) Inventors: Mill-Jer Wang, Hsin-Chu (TW); Chih-Chia Chen, Taipei (TW); Hung-Chih Lin, Hsin-Chu (TW); Ching-Nen Peng, Hsin-Chu (TW); Hao Chen, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 144 days.

(21) Appl. No.: 14/561,442

(22) Filed: Dec. 5, 2014

(65) Prior Publication Data

US 2015/0087089 A1    Mar. 26, 2015

Related U.S. Application Data

(62) Division of application No. 13/105,603, filed on May 11, 2011, now Pat. No. 8,922,230.

(51) Int. Cl.
| | |
|---|---|
| *G01R 31/20* | (2006.01) |
| *G01R 31/28* | (2006.01) |
| *G01R 1/073* | (2006.01) |
| *H01L 21/66* | (2006.01) |

(52) U.S. Cl.
    CPC ..... *G01R 31/2884* (2013.01); *G01R 1/07378* (2013.01); *G01R 31/2834* (2013.01); *G01R 31/2886* (2013.01); *H01L 22/14* (2013.01); *Y02P 80/30* (2015.11)

(58) Field of Classification Search
    None
    See application file for complete search history.

(56) References Cited

U.S. PATENT DOCUMENTS

| | | | |
|---|---|---|---|
| 5,070,297 A | 12/1991 | Kwon et al. | |
| 6,867,597 B2 | 3/2005 | Hauptner et al. | |
| 6,867,610 B2 | 3/2005 | Bottcher et al. | |
| 7,307,427 B2 * | 12/2007 | Jacobsen | G01R 31/2853 324/519 |
| 7,642,803 B2 | 1/2010 | Choi | |
| 8,933,345 B1 * | 1/2015 | Rahman | H01L 23/147 174/262 |
| 2003/0210031 A1 | 11/2003 | Miller | |
| 2004/0100293 A1 | 5/2004 | Bottcher et al. | |
| 2010/0155888 A1 * | 6/2010 | Christo | H01L 21/6835 257/532 |

* cited by examiner

*Primary Examiner* — Minh N Tang
(74) *Attorney, Agent, or Firm* — Slater Matsil, LLP

(57) ABSTRACT

A method comprises connecting a testing setup having a plurality of probes to a device under test having a plurality of vias, wherein a probe is aligned with a corresponding via of the device under test and conducting a plurality of via electrical characteristic tests through a conductive path comprising the vias, the probes and a plurality of conductive devices, each of which connects two adjacent probes, wherein the conductive devices are in the testing setup.

18 Claims, 9 Drawing Sheets

3D IC TESTING APPARATUS

This application is a divisional of U.S. patent application Ser. No. 13/105,603, entitled "3D IC Testing Apparatus," filed on May 11, 2011, now U.S. Pat. No. 8,922,230, which application is incorporated herein by reference.

BACKGROUND

As semiconductor technologies evolve, three dimensional (3D) integrated circuits (ICs) emerge as an effective alternative to further reduce the physical size of a semiconductor chip. In a 3D IC based semiconductor chip, active circuits are fabricated on different wafers and each wafer die is stacked on top of another wafer die using pick-and-place techniques. Much higher density can be achieved by employing 3D IC. Furthermore, 3D ICs can achieve smaller form factors, cost-effectiveness, increased performance and lower power consumption.

During the development of 3D ICs, an intermediate stage called 2.5D ICs was created. In a 2.5D IC, there may be a variety of dies comprising active circuits and a plurality of interposers comprising through silicon vias (TSVs). Unlike a 3D IC, the variety of dies comprising active circuits in a 2.5D IC may not comprise TSVs. Instead, various 2.5D dies rely on a 2.5D interposer providing TSVs and further interconnecting the various 2.5D dies. Despite that 2.5D ICs may have a different structure from 3D ICs, 2.5D ICs are loosely considered as a subcategory of 3D ICs.

A 3D IC device may comprise a top active circuit layer, a bottom active circuit layer and a plurality of inter-layers. One of the inter-layers may be an interposer. In a 3D IC, both active circuit layers and interposers may comprise TSVs. As a result, a variety of active circuit layers may be stacked together in a 3D IC without an interposer. However, interposers in 3D ICs are still widely used because an interposer, as a relatively large silicon layer, can accommodate various wafer dies different in size. More particularly, interposers can bond various wafer dies together by using micro-bumps. Furthermore, by employing an interposer, the complicated thermal distribution issue of a 3D IC can be simplified.

TSVs are used to transfer signals between different layers of a 3D IC. Due to operation variations in a 3D IC fabrication process, defects may occur while forming TSVs before stacking different layers together. In order to ensure that the reliability and the yield of 3D ICs meet specifications, some key parameters of TSVs such as resistance, capacitance, leakage and the like are tested before stacking a variety of wafers together. The pre-stacking TSV testing can reduce yield losses due to defective TSVs.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a test solution for a through-silicon via (TSV) chain. The invention may also be applied, however, to a variety of TSV electrical characteristic tests.

Figure 1:
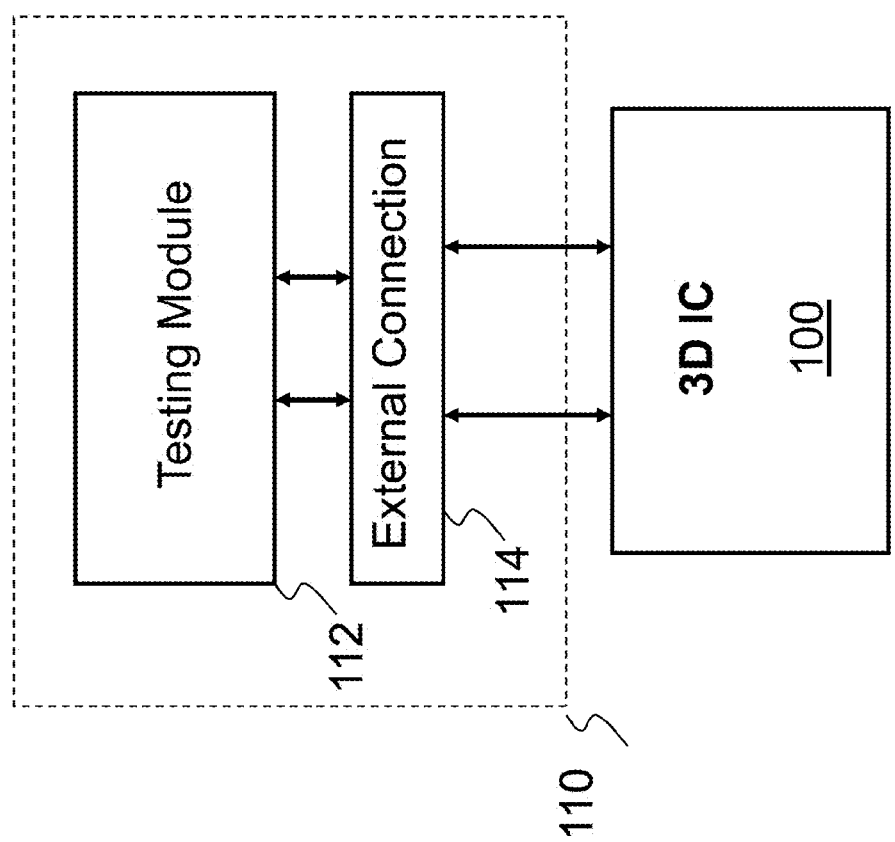
FIG. 1 illustrates a block diagram of a three-dimensional (3D) integrated circuit (IC) testing apparatus in accordance with an embodiment.

Referring initially to FIG. 1, a block diagram of a three-dimensional (3D) integrated circuit (IC) testing apparatus is illustrated in accordance with an embodiment. When a 3D IC 100 operates in a testing mode, the 3D IC testing apparatus 110 is coupled to the 3D IC 100 via a plurality of testing channels such as testing probes. The 3D IC 100 may comprise a plurality of silicon layers stacked together wherein various active circuits located in different layers are connected together through a plurality of TSVs, micro bumps and/or flip chip bumps. More particularly, within a layer, various active circuits are connected to the TSVs in the layer. Furthermore, a TSV in a layer is further connected to a corresponding TSV in an adjacent layer through a micro bump, a flip chip bump, a solder ball or the like. In sum, active circuits in different layers of a 3D IC can be interconnected through a network formed by TSVs and various bumps used to connect two or more TSVs located in different layers.

The 3D IC testing apparatus 110 may be a probe card (not shown but illustrated in FIG. 2) in accordance with an embodiment. On the probe card, a plurality of testing modules 112 are employed for performing different tests of TSVs, such as resistance, capacitance, leakage, frequency, thermal and the like. A 3D IC may comprise an interposer. Before the interposer and other wafer layers are bonded together, the 3D IC testing apparatus 110 may perform various TSV characteristic tests. In some regions of the interposer layer, a redistribution layer (not shown) or an active circuit may be used to route and connect two adjacent TSVs. Furthermore, a plurality of redistribution layers (not shown) or active circuits, each of which connects two adjacent TSVs may bridge many TSVs so as to form a TSV chain. As a result, the 3D IC testing apparatus 110 may test a group of TSVs within one single testing operation by injecting a testing signal at one end of the TSV chain and receiving a result at the other end of the TSV chain. One advantageous feature of testing a TSV chain is that some TSV electrical characteristic tests such as open circuit can be tested efficiently through testing a group of TSVs.

However, some regions of an interposer layer may not comprise redistribution layers or active circuits. In addition, as technologies advance, some 3D ICs are based upon 3D TSV stacking technology wherein various wafer dies are stacked together directly without employing an interposer layer. As a result, redistribution layers or the like may not be formed between two adjacent TSVs. In order to test the electrical characteristics of the TSVs located in the region not having redistribution layers or active circuits, a 3D IC testing apparatus such as a probe card or ATE has to test each TSV individually.

In accordance with an embodiment, the 3D IC testing apparatus 110 may comprise a connection device 114, which connects two adjacent TSVs externally. By employing the connection device 114, two adjacent TSVs can be externally connected together through the external connection device 114. It should be noted that while FIG. 1 shows a single external connection device placed between the 3D IC 100 and testing module 112, the external connection device 114 may comprise a plurality of connection devices, each of which connects two TSVs together so that a TSV chain is formed by a plurality of TSVs from the 3D IC 100 and various connection devices from the external connection device 114. The detailed operation of the external connection device 114 will be described below with respect to FIGS. 2-6.

Figure 2:
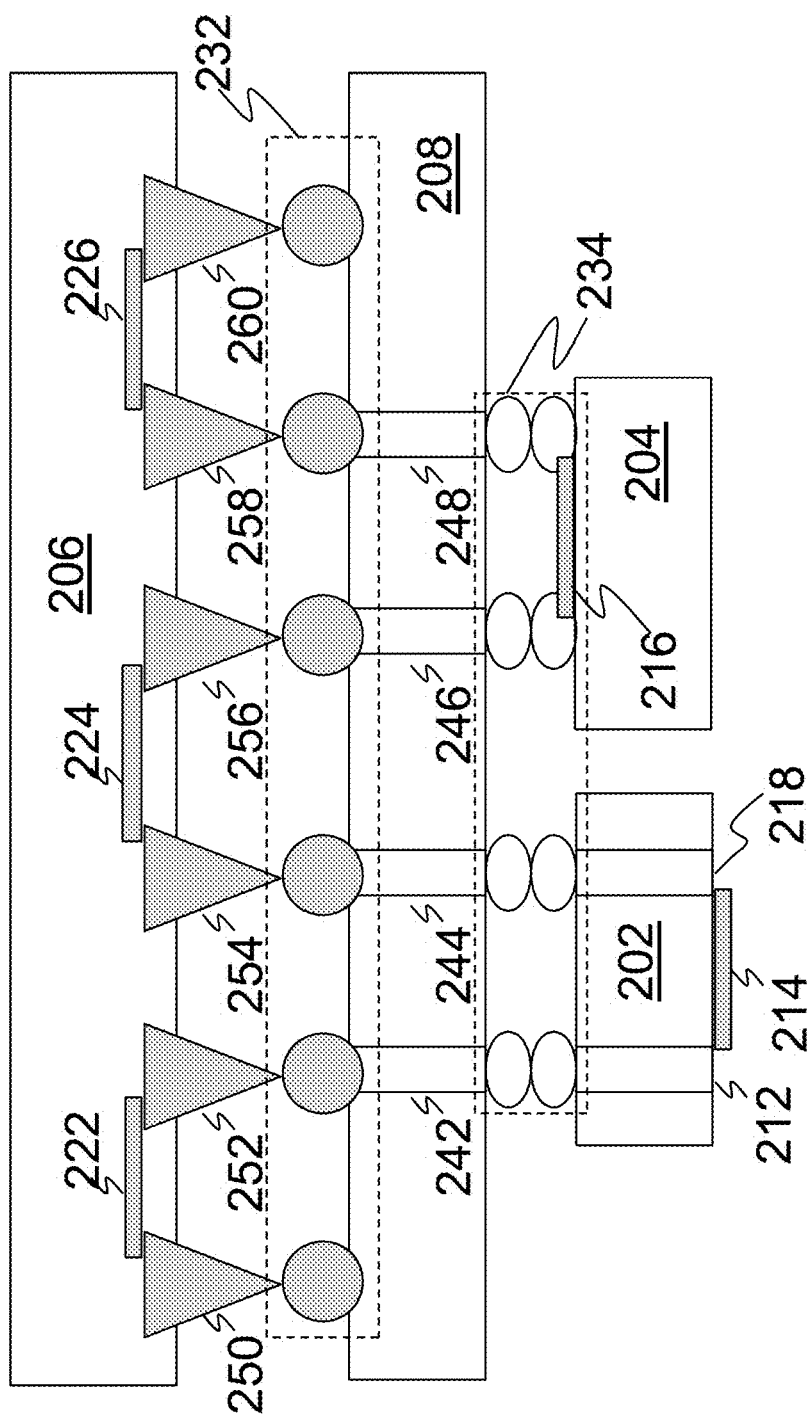
FIG. 2 illustrates a block diagram of a 3D IC testing apparatus and an interposer comprising a plurality of TSVs.

FIG. 2 illustrates a block diagram of a 3D IC testing apparatus and an interposer comprising a plurality of TSVs. In accordance with an embodiment, the interposer 208 comprises four TSVs, 242, 244, 246 and 248 respectively. As shown in FIG. 2, on the interposer 208, there are no redistribution layers or active circuits formed between two adjacent TSVs (e.g., TSVs 242 and 244). In order to test the four TSVs together, a probe card 206 having external connection devices 222, 224 and 226 is employed to perform characteristic tests on the top side of the interposer 208. One skilled in the art will recognize that there may be various solutions for implementing external connection devices (e.g., external device 222) and that temporary external connection devices could be employed (such as employing a solder bridge or jump wire) and that other circuits, (e.g., a relay array providing external connections, etc.) could be employed for this function.

In accordance with an embodiment, the probe card 206 may comprise six probes, 250, 252, 254, 256, 258 and 260. The probe card 206 may further comprise three external connection devices 222, 224 and 226 connecting the probes and the TSVs in the interposer 208 together so as to form a conductive loop. More particularly, a first external connection device 222 connects the probe 250 and the probe 252. A second external connection device 224 is placed between the probe 254 and the probe 256. Likewise, a third external connection device 226 is formed between the probe 258 and the probe 260. As a result, the external connection devices and the probes of the probe card 206 form an electrically conductive loop with a few gaps. However, the gaps can be bridged when the probe card 206 is used to test the TSVs of the interposer 208. As shown in FIG. 2, for example, there is a gap between the probe 252 and the probe 254. The gap can be bridged by a conductive channel, which is formed by the flip chip bumps (e.g., flip chip bumps 232), the TSV 242, the TSV 244 and a bottom connection loop.

Two dummy dies 202 and 204 are mounted on the bottom side of the interposer 208. The dummy die 202 illustrates an implementation of an external connection device via a 3D IC die. In contrast, the dummy die 204 illustrates an implementation of an external connection device via 2.5D IC die. As known in the art, a 3D IC die (e.g., 3D IC die 202) has a plurality of TSVs formed within the 3D IC die. As a result, the external connection device 214 can be formed either on the top side or on the bottom side of the dummy die. According to an embodiment, the external connection device 214 is formed on the metal layer, which is located on the bottom side of the dummy die 202. Through two TSVs 212, 218, and two micro bumps (e.g., micro bumps 234), the external connection device 214 connects the bottom terminal of the TSV 242 and the bottom terminal of the TSV 244 together. On the other hand, an external connection device can be placed on a 2.5D IC die. As shown in FIG. 2, the dummy die 204, as a 2.5D IC die, does not comprise TSVs. As a result, the external connection device 216 may be formed on the metal layer, which is located on the top side of the dummy die 216. Similarly, through two micro bumps 234, the external connection device 216 connects the bottom terminal of the TSV 246 and the bottom terminal of the TSV 248 together. It should be noted that while FIG. 2 illustrates two dummy dies, this diagram is merely an example, which should not unduly limit the scope of the claims. One of ordinary skill in the art would recognize many variations, alternatives, and modifications. For example, the dummy dies 202 and 204 can be replaced by active chips or test chips. In sum, two dies (e.g., dummy dies 202 and 204) provide a conductive loop connecting bottom terminals of the TSVs of the interposer 208. Furthermore, by employing external connection devices, a TSV chain can be formed so that a group of TSVs may be tested all at once.

Figure 3:
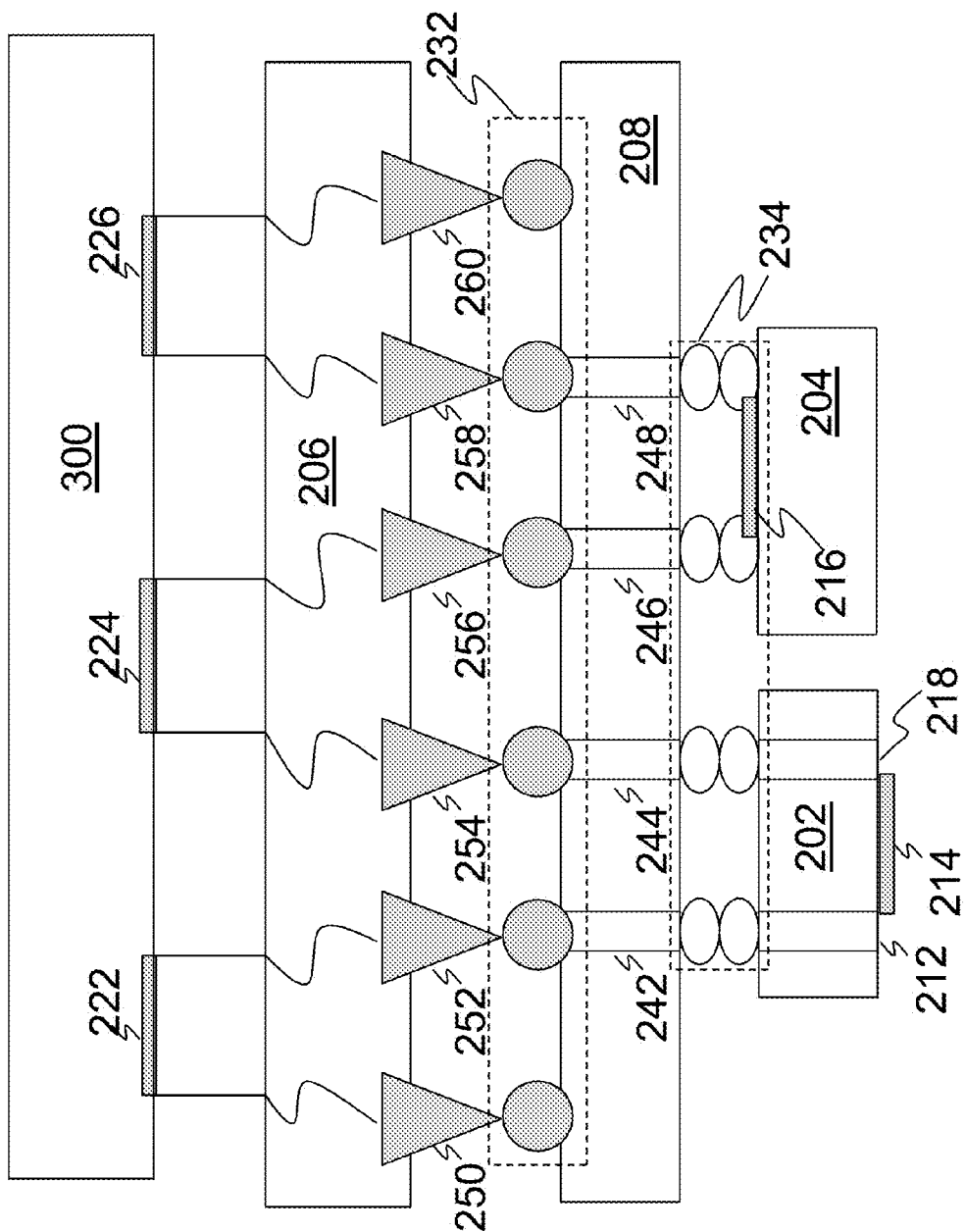
FIG. 3 illustrates a block diagram of an ATE based 3D IC testing apparatus and an interposer comprising a plurality of TSVs.

FIG. 3 illustrates a block diagram of a 3D IC testing apparatus comprising automatic test equipment (ATE) and an interposer comprising a plurality of TSVs. According to another embodiment, an ATE board 300 may be employed to perform electrical characteristic tests of the TSVs of the interposer 208. As shown in FIG. 3, the system configuration of interposer 208, the probe card 206 and the dummy dies 202 and 204 is similar to that of FIG. 2. The detailed operation has been discussed with respect to FIG. 2, and hence is not described herein to avoid repetition. As illustrated in FIG. 2, according to another embodiment, the first external connection device 222, the second external connection device 224 and the third external connection device 226 may be formed on the ATE board 300. As described with respect to FIG. 2, the external connection devices 222, 224 and 226 may be solder bridges, jumper wires, relays or the like. It should be noted that a relay array is a preferable embodiment for implementing the external connection devices on an ATE board because there may be various relays available on an ATE board.

FIG. 3 shows that through conductive channels between the probe card 206 and the ATE board 300, the first external connection device 222, the second external connection device 224 and the third external connection device 226 are connected to the probes of the probe card 206 and further connected to the corresponding TSVs as described with respect to FIG. 2. It should be noted that FIG. 3 illustrates an ATE board in connection with a probe card. The ATE board 300 illustrated herein is limited solely for the purpose of clearly illustrating the inventive aspects of the various embodiments. The present invention is not limited to a particular type of testing equipment. In sum, the external connection devices can be formed in a variety of testing vehicles coupled to a device under test.

Figure 4:
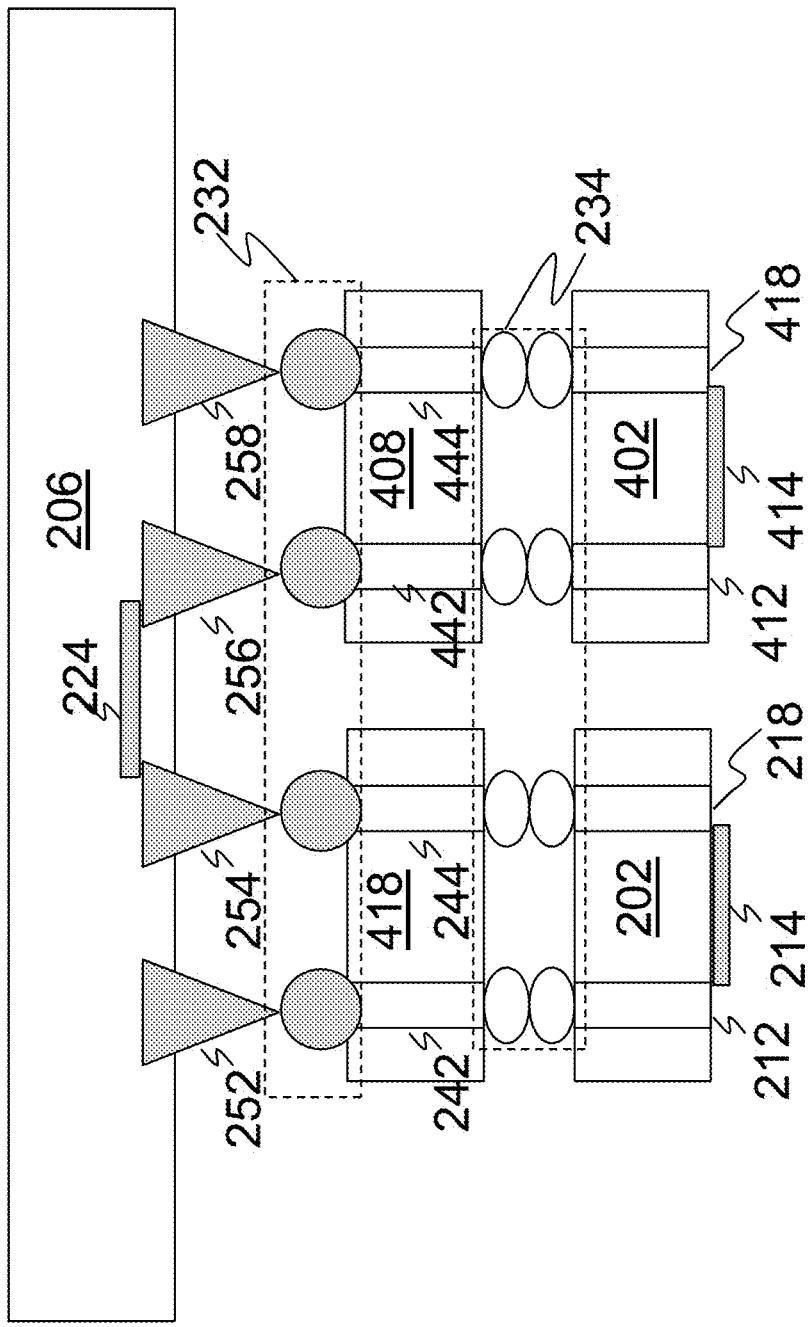
FIG. 4 illustrates a block diagram of a 3D IC testing apparatus and a 3D TSV stack in accordance with an embodiment.

FIG. 4 illustrates a block diagram of a 3D IC testing apparatus and a 3D TSV stack. According to an embodiment, a 3D IC may be formed by stacking a plurality of 3D IC dies together without employing an interposer. As shown in FIG. 4, the 3D IC may comprise four 3D IC dies 202, 418, 402 and 408. The 3D IC dies 202 and 402 can be dummy dies wherein the bottom connection device 214 is formed between the bottom terminals of the TSV 212 and the TSV 218, and the bottom connection device 414 is formed between the bottom terminals of the TSV 412 and the TSV 418. Alternatively, the 3D IC dies 202 and 402 may be active dies having redistribution layers formed between the bottom terminals of TSVs of the 3D IC dies 202 and 402. In the probe card 206, an external connection device 224 is used to bridge the gap between the probe 254 and the probe 256 so as to form a conductive loop between the probe 252 and the probe 258. As a result, a testing signal can be applied to the probe 252 and the probe card 206 receives a response signal at the probe 258. By analyzing the response signal, the probe card 206 may detect some defects such as open circuit or the like.

Figure 5:
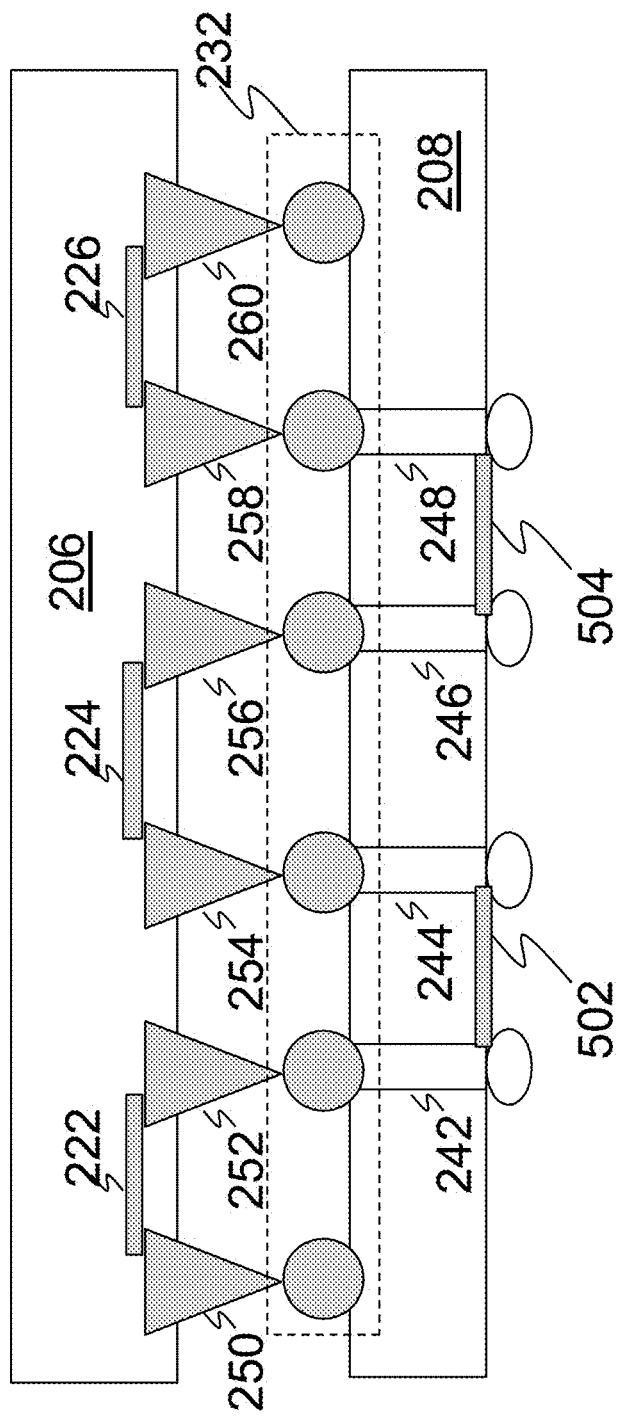
FIG. 5 illustrates a block diagram of a 3D IC testing apparatus and an interposer having redistribution layers or active circuits formed on one side of the interposer.

FIG. 5 illustrates a block diagram of a 3D IC testing apparatus and an interposer having redistribution layers or active circuits formed on one side of the interposer. As shown in FIG. 5, the top side of the interposer 208 and the probe card 206 are similar to that of FIG. 2. The detailed operation has been discussed with respect to FIG. 2, and hence is not described herein to avoid repetition. As illustrated in FIG. 5, according to another embodiment, a first external connection device 502 and a second external connection device 504 may be formed on the bottom side of the interposer 208. More particularly, the first external connection device 502 connects the bottom terminals of the TSV 242 and the TSV 244 together. Likewise, the second external connection device 504 connects the bottom terminals of the TSV 246 and the TSV 248. Furthermore, through four flip chip bumps and the probes of the probe card 206, a conductive loop is formed between the probe 250 and the probe 260. As a result, the TSVs 242, 244, 246 and 248 can be tested all at once.

Figure 6:
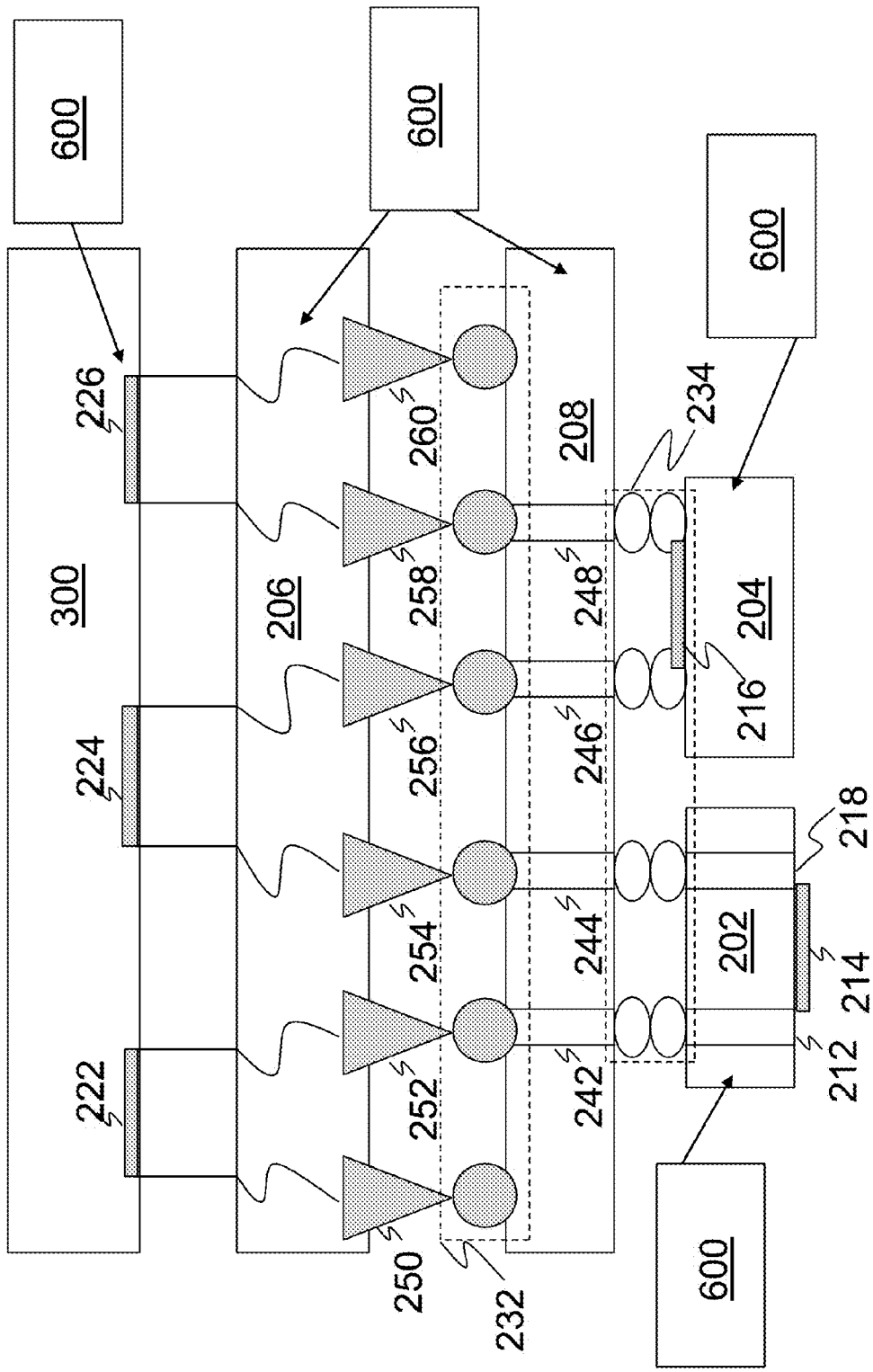
FIG. 6 illustrates a variety of testing modules applicable to a 3D IC testing apparatus shown in FIG. 3.

FIG. 6 illustrates a variety of testing modules applicable to a 3D IC testing apparatus shown in FIG. 3. The system configuration of FIG. 6 is similar to that of FIG. 3, and hence is not described in detail to avoid repetition. Various testing modules 600 may be employed to perform a variety of electrical characteristic tests such as resistance, capacitance, leakage current, frequency, thermal, stress and the like. The testing modules 600 may be placed in the ATE board 300, the probe card 206, the interposer 208, the 3D IC die 202, the 2.5D IC die 204 or the like. Furthermore, a testing module 600 located in testing vehicles such as the ATE board 300 and the probe card 206 can be replaced or substituted by a different testing module when the purpose of testing changes. For example, a resistance sensor may be mounted on the ATE board 300 when the system performs a test to measure the resistance of a TSV. Alternatively, the resistance sensor can be replaced by a leakage current sensor when the system finishes the resistance test and starts to test the leakage current of the TSV. The detailed operation principles of the testing modules 600 will be described below with respect to FIGS. 7-9.

Figure 7:
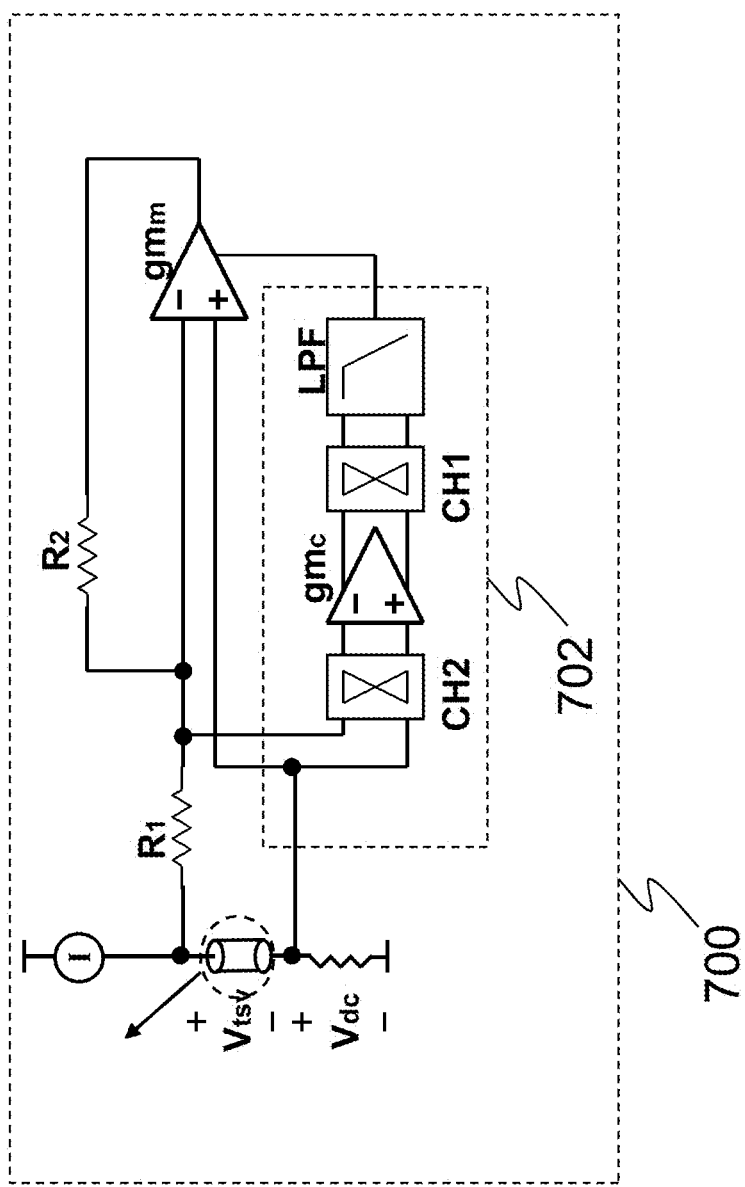
FIG. 7 illustrates a schematic diagram of a resistance sensor in accordance with an embodiment.

FIG. 7 illustrates a schematic diagram of a resistance sensor in accordance with an embodiment. The resistance sensor 700 comprises a current source I and a reference voltage $V_{dc}$ formed by the voltage drop when the current source I flows through a resistor. The resistance sensor 700 may further comprise an operational amplifier $gm_m$, a first resistor R1, a second resistor R2 and a noise reduction circuit 702. The noise reduction circuit 702 comprises a first chopper switch CH1, a second chopper switch CH2, a compensation amplifier $gm_c$ and a low pass filter LPF. In order to attenuate the dc offset and noise of the operational amplifier $gm_m$, the input signal of the operation amplifier $gm_m$ is modulated by the second chopper switch CH2 to a higher frequency. The modulated dc offset and noise are further amplified by the compensation amplifier $gm_c$. Subsequently, the first chopper switch CH1 de-modulated the input signal while keeping the modulated dc offset and noise at the higher frequency. Furthermore, the low pass filter LPF eliminates the modulated dc offset and noise. As a result, the noise reduction circuit 702 helps to reduce the interference from the dc offset and noise so that the operational amplifier $gm_m$ can report an accurate value of the resistance of a TSV.

According to the operation principle of operational amplifiers, the following relationship can be derived from the system configuration of the resistance sensor 700. The resistance of a TSV and the output of the resistance sensor 700 satisfy the following equation:

$$V_{out} = V_{dc} - \frac{R_2}{R_1}(I \cdot R_{tsv})$$

An advantageous feature of employing the resistance sensor 700 is that a TSV's resistance value can be estimated through the output voltage value of the resistance sensor 700. It should be noted that while FIG. 7 illustrates an operational amplifier based resistance sensor, the schematic diagram is merely an example, which should not unduly limit the scope of the claims. One of ordinary skill in the art would recognize many variations, alternatives and modifications. For example, an instrument amplifier can be used to replace the resistance sensor 700 shown in FIG. 7.

Figure 8:
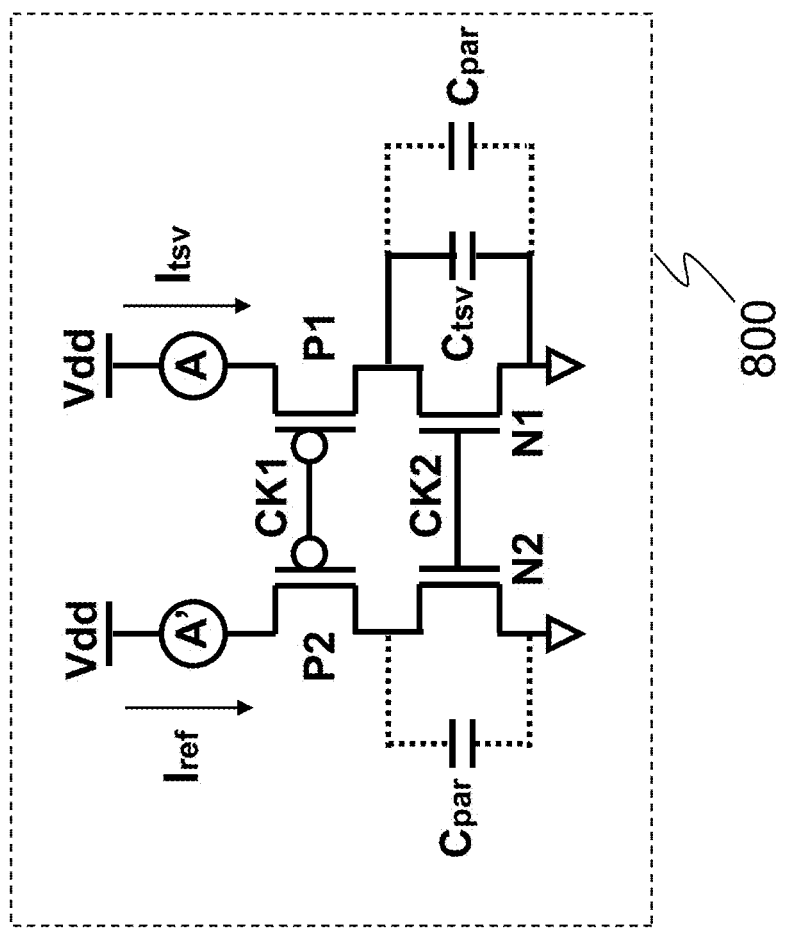
FIG. 8 illustrates a schematic diagram of an illustrative embodiment of a capacitance sensor.

FIG. 8 illustrates a schematic diagram of an illustrative embodiment of a capacitance sensor. The capacitance sensor 800 comprises a pair of p-type metal oxide semiconductor (PMOS) transistors P1, P2 and a pair of n-type metal oxide semiconductor (NMOS) transistors N1, N2. The PMOS transistor P1 and the NMOS transistor N1 are connected in series to form a TSV current leg. Likewise, the PMOS transistor P2 and the NMOS transistor N2 are connected in series to form a reference current leg. The gates of the PMOS transistor P1 and the PMOS transistor P2 are coupled to a first clock signal CK1. Similarly, the gates of the NMOS transistor N1 and the NMOS transistor N2 are coupled to a second clock signal CK2. There may be a phase shift between the first clock signal CK1 and the second clock signal CK2. More specifically, the first clock signal CK1 and the second clock signal CK2 are configured such that the current sources Iref and Itsv charge the output of the NMOS transistor N2 and the output of the NMOS transistor N1 respectively when the first clock CK1 turns on both the PMOS transistor P2 and the PMOS transistor P1; on the other hand, the outputs of the NMOS transistor N2 and the NMOS transistor N1 are discharged to zero volts when the second clock signal CK2 turns on both the NMOS transistor N2 and the NMOS transistor N1.

As shown in FIG. 8, both the TSV leg and the reference current leg share the same system configuration except that a TSV to be measured is connected between the drain and the source of the NMOS transistor N1. According to the voltage and current relationship of a capacitor, the average current flowing through a capacitor is proportional to the product of the capacitance value and the voltage change across the capacitor. More specifically, the relationship between the current in the reference current leg and the voltage across the reference current leg can be expressed as:

$$I_{ref\_avg} = V_{dd} \cdot C_{par} \cdot f$$

Where $C_{par}$ is the parasitic capacitance across the NMOS transistor N2 and f is the operating frequency of the clock signals CK1 and CK2. Likewise, the relationship between the current in the TSV leg and the voltage across the TSV leg can be expressed as:

$$I_{tsv\_avg} = V_{dd} \cdot (C_{par} + C_{tsv}) \cdot f$$

The capacitance sensor 800 can estimate the capacitance of a TSV by reading the current difference between the TSV leg and the reference current leg and further back-calculating the capacitance through the following equation:

$$I_{tsv\_avg} - I_{ref\_avg} = V_{dd} \cdot C_{tsv} \cdot f$$

In sum, by employing the capacitance sensor 800, the capacitance of a TSV can be calculated from the equation shown above.

Figure 9:
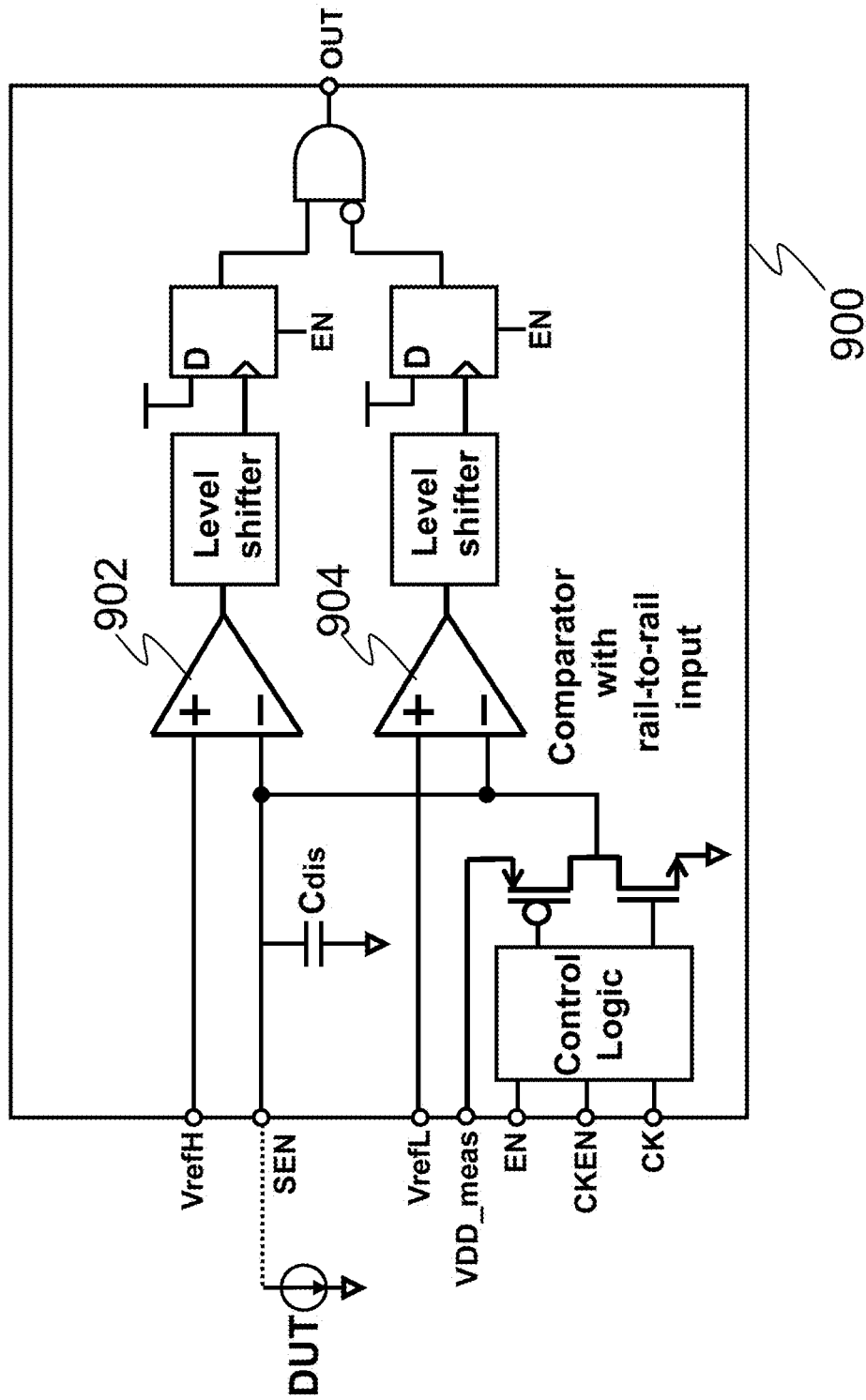
FIG. 9 illustrates a schematic diagram of an illustrative embodiment of a leakage current sensor.

FIG. 9 illustrates a schematic diagram of an illustrative embodiment of a leakage current sensor. The leakage current sensor 900 comprises a capacitor $C_{dis}$, a first comparator 902, a second comparator 904, various control logic circuits and interface circuits. The positive input of the first comparator 902 is coupled to a high threshold voltage $V_{refH}$. Likewise, the positive input of the second comparator 904 is coupled to a low threshold voltage $V_{refL}$. Both the negative input of the first comparator 902 and the negative input of the second comparator 904 are coupled to a device under test (DUT). Furthermore, the capacitor $C_{dis}$ is connected in parallel with the DUT and pre-charged to a voltage potential VDD (not shown). When the DUT (e.g., a TSV) operates in a testing mode, the leakage current from the DUT discharges the voltage across the capacitor $C_{dis}$. As a result, the voltage across $C_{dis}$ is discharged from VDD down to a lower voltage level. The first comparator 902 detects the voltage drop when the voltage across $C_{dis}$ drops below the high threshold voltage $V_{refH}$. As a consequence, the output of the leakage current sensor 900 changes from a logic low state to a logic high state. As known in the art, the output of the leakage current sensor 900 remains high until the voltage across $C_{dis}$ drops below the low threshold voltage $V_{refL}$. Therefore, in response to the gradual voltage drop across $C_{dis}$, the output of the leakage current sensor 900 generates a pulse having a width proportional to the amplitude of the leakage current from the DUT. More particularly, the leakage current of the DUT can be expressed by the following equation:

$$I_{DUT} = \frac{C_{dis} \cdot (V_{refH} - V_{refL})}{\Delta T}$$

Where $\Delta T$ is the width of the pulse generated by the leakage current sensor 900.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   connecting a testing setup having a plurality of probes to a device under test having a plurality of vias in a first substrate, wherein a probe is aligned with a corresponding via of the device under test, the first substrate being electrically coupled to a semiconductor die using micro bumps, the semiconductor die having a conductive element; and
   conducting a plurality of via electrical characteristic tests through a conductive path comprising the plurality of vias, the probes, the semiconductor die and the conductive element, the conductive element electrically coupling two adjacent probes, wherein the first substrate is stacked on a first side of the semiconductor die, and wherein the conductive element is on a second side of the semiconductor die.

2. The method of claim 1, further comprising:
   connecting a first terminal of a first probe to a first terminal of a first via through a first flip chip bump; and
   connecting a first terminal of a second probe to a first terminal of a second via through a second flip chip bump, wherein a first conductive device is coupled between a second terminal of the first probe and a second terminal of the second probe, wherein the first conductive device is in the testing setup.

3. The method of claim 2, further comprising:
   a third via; and
   a dummy die coupled between the second via and the third via, wherein an external connection device is formed on the dummy die and electrically connects the second via with the third via.

4. The method of claim 3, wherein:
   the first via, the first probe, the first conductive device, the second probe, the second via, the external connection device and the third via form a conductive chain.

5. The method of claim 1, wherein:
   the testing setup is an automatic testing equipment (ATE) board.

6. The method of claim 1, further comprising:
   connecting the testing setup with the device under test having the plurality of vias, wherein the device under test comprises an interposer and a dummy die, and wherein the vias are in the interposer and an external connection device is on the dummy die, and wherein the external connection device connects two adjacent vias.

7. The method of claim 1, further comprising:
   connecting the testing setup with the device under test having the plurality of vias, wherein the device under test comprises a plurality of 3D IC dies, and wherein the vias are in a first 3D IC die and an external connection device is on a second 3D IC die, and wherein the first 3D IC die is connected with the second 3D IC die through a plurality of micro bumps.

8. A method comprising:
providing a device under test comprising a plurality of through vias and a connection device coupled between two adjacent through vias;
connecting a testing setup having a plurality of probes to the device under test, wherein a probe is aligned with a corresponding via of the device under test and the testing setup comprises a plurality of conductive devices, each of which connects two adjacent probes;
forming a conductive chain comprising the plurality of through vias of the device under test, the probes, the connection device, a first micro bump, a second micro bump and the plurality of conductive devices as a result of connecting the testing setup having a plurality of probes to the device under test, wherein the first micro bump and the second micro bump are between and in contact with the plurality of through vias of the device under test and a first side of a semiconductor die, and wherein the connection device is on a second side of the semiconductor die and connected to the first micro bump and the second micro bump through connecting elements embedded in the semiconductor die; and
conducting a plurality of via electrical characteristic tests through the conductive chain.

9. The method of claim 8, further comprising:
forming the conductive chain through a removable contact between the probes and the device under test.

10. The method of claim 8, further comprising:
conducting resistance, capacitance and leakage current tests of the plurality of through vias through the conductive chain.

11. The method of claim 8, wherein the device under test comprises an interposer and a dummy die, and wherein:
the vias are in the interposer and the connection device is on the dummy die, and wherein the connection device connects two adjacent vias through first connecting elements embedded in the dummy die, and second connecting elements between the interposer and the dummy die.

12. The method of claim 8, wherein the device under test comprises a plurality of 3D IC dies, and wherein:
the vias are in a first 3D IC die and the connection device is on a second 3D IC die, and wherein the first 3D IC die is connected with the second 3D IC die through a plurality of micro bumps between the first 3D IC die and the second 3D IC die, and third connecting elements embedded in the second 3D IC die.

13. A method comprising:
providing a plurality of connection devices formed in a testing apparatus; and
forming a through silicon via (TSV) chain by coupling a plurality of TSVs in a device under test (DUT) with the plurality of connection devices, wherein the TSV chain comprises a first micro bump between and in contact with a first via of the plurality of TSVs and a first side of a semiconductor die, and a second micro bump between and in contact with a second via of the plurality of TSVs and the first side of the semiconductor die, and wherein at least one conductive element is on a second side of the semiconductor die and directly connects two vias of the semiconductor die.

14. The method of claim 13, further comprising:
providing a plurality of dummy dies having a plurality of conductive elements coupled to one side of the DUT; and
forming the TSV chain by coupling the plurality of TSVs in the DUT with the plurality of connection devices in the testing apparatus and the plurality of conductive elements in the dummy dies.

15. The method of claim 13, further comprising:
generating a testing signal at a first terminal of the TSV chain; and
receiving a result signal at a second terminal of the TSV chain, wherein the result signal comprises electrical characteristics of the plurality of TSVs.

16. The method of claim 13, further comprising:
stacking a plurality of 3D dies to form a 3D device;
connecting a plurality of TSV terminals on a top side of the 3D device with the plurality of connection devices formed in the testing apparatus; and
connecting a plurality of TSV terminals on a bottom side of the 3D device with a plurality of connection paths formed on the bottom side of the 3D device.

17. The method of claim 13, wherein the DUT is an interposer having a first side coupled to the testing apparatus and a second side coupled to a plurality of dummy dies.

18. The method of claim 13, wherein the DUT is an interposer having a first side coupled to the testing apparatus and a second side having a plurality of connection elements, wherein each of the connection elements connects two adjacent terminals of a TSV.

* * * * *